(12) United States Patent
Rubin et al.

(10) Patent No.: US 10,147,815 B2
(45) Date of Patent: Dec. 4, 2018

(54) FULLY SILICIDED LINERLESS MIDDLE-OF-LINE (MOL) CONTACT

(71) Applicant: INTERNATIONAL BUSINESS MACHINES CORPORATION, Armonk, NY (US)

(72) Inventors: Joshua M. Rubin, Albany, NY (US); Tenko Yamashita, Schenectady, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/463,545

(22) Filed: Mar. 20, 2017

(65) Prior Publication Data

US 2017/0194202 A1      Jul. 6, 2017

Related U.S. Application Data

(63) Continuation of application No. 14/967,736, filed on Dec. 14, 2015, now Pat. No. 9,634,113, which is a
(Continued)

(51) Int. Cl.
*H01L 29/78* (2006.01)
*H01L 23/485* (2006.01)
(Continued)

(52) U.S. Cl.
CPC .... *H01L 29/7845* (2013.01); *H01L 21/02063* (2013.01); *H01L 21/2855* (2013.01);
(Continued)

(58) Field of Classification Search
CPC ................ H01L 21/76889; H01L 29/4933
See application file for complete search history.

(56) References Cited

U.S. PATENT DOCUMENTS 9,634,113 B2 *  4/2017  Rubin ................. H01L 29/7845
2013/0137260 A1 *  5/2013  Alptekin ........... H01L 21/28518
                                                            438/664
(Continued)

OTHER PUBLICATIONS

List of IBM Patents or Patent Applications Treated as Related; (Appendix P), Filed May 26, 2017; 2 pages.

*Primary Examiner* — Moazzam Hossain
*Assistant Examiner* — Farun Lu
(74) *Attorney, Agent, or Firm* — Cantor Colburn LLP; Vazken Alexanian

(57) ABSTRACT

A method of making a semiconductor device includes forming a source/drain region on a substrate; disposing a gate stack on the substrate and adjacent to the source/drain region, the gate stack including a gate spacer along a sidewall of the gate stack; disposing an inter-level dielectric (ILD) layer on the source/drain region and the gate stack; removing a portion of the ILD layer on the source/drain region to form a source/drain contact pattern; filling the source/drain contact pattern with a layer of silicon material, the layer of silicon material being in contact with the source/drain region and in contact with the gate spacer; depositing a metallic layer over the first layer of silicon material; and performing a silicidation process to form a source/drain contact including a silicide.

10 Claims, 13 Drawing Sheets

Related U.S. Application Data continuation of application No. 14/856,918, filed on Sep. 17, 2015, now Pat. No. 9,853,151.

(51) Int. Cl.
*H01L 21/768* (2006.01)
*H01L 21/02* (2006.01)
*H01L 29/66* (2006.01)
*H01L 23/532* (2006.01)
*H01L 29/417* (2006.01)
*H01L 21/285* (2006.01)
*H01L 29/49* (2006.01)
*H01L 29/40* (2006.01)

(52) U.S. Cl.
CPC .. *H01L 21/28525* (2013.01); *H01L 21/76805* (2013.01); *H01L 21/76814* (2013.01); *H01L 21/76865* (2013.01); *H01L 21/76889* (2013.01); *H01L 21/76895* (2013.01); *H01L 21/76897* (2013.01); *H01L 23/485* (2013.01); *H01L 23/53271* (2013.01); *H01L 29/401* (2013.01); *H01L 29/41783* (2013.01); *H01L 29/4975* (2013.01); *H01L 29/665* (2013.01); *H01L 29/66553* (2013.01); *H01L 29/66628* (2013.01); *H01L 29/66795* (2013.01); *H01L 29/785* (2013.01); *H01L 29/7848* (2013.01)

(56) References Cited

U.S. PATENT DOCUMENTS

| | | | |
|---|---|---|---|
| 2013/0181264 A1* | 7/2013 | Liao | H01L 29/41791 257/288 |
| 2014/0242802 A1* | 8/2014 | Hsu | H01L 21/76814 438/715 |
| 2017/0084742 A1 | 3/2017 | Rubin et al. | |

* cited by examiner

US 10,147,815 B2

FULLY SILICIDED LINERLESS MIDDLE-OF-LINE (MOL) CONTACT

PRIORITY

This application is a continuation of and claims priority from U.S. patent application Ser. No. 14/967,736, filed on Dec. 14, 2015, entitled "A FULLY SILICIDED LINERLESS MIDDLE-OF-LINE (MOL) CONTACT," which is a continuation of and claims priority from U.S. patent application Ser. No. 14/856,918, filed on Sep. 17, 2015, entitled "A FULLY SILICIDED LINERLESS MIDDLE-OF-LINE (MOL) CONTACT," each application is incorporated herein by reference in its entirety.

BACKGROUND

The present invention relates to metal-oxide-semiconductor field-effect transistors (MOSFET), and more specifically, to contacts in MOSFET transistors.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

The FinFET is a type of MOSFET. The FinFET is a double-gate or multiple-gate MOSFET device that mitigates the effects of short channels and reduces drain-induced barrier lowering. The "fin" refers to the narrow channel between source and drain regions. A thin dielectric layer on either side of the fin separates the fin channel from the gate.

SUMMARY

According to an embodiment, a method of making a semiconductor device includes forming a source/drain region on a substrate; disposing a gate stack on the substrate and adjacent to the source/drain region, the gate stack including a gate spacer along a sidewall of the gate stack; disposing an inter-level dielectric (ILD) layer on the source/drain region and the gate stack; removing a portion of the ILD layer on the source/drain region to form a source/drain contact pattern; filling the source/drain contact pattern with a layer of silicon material, the layer of silicon material being in contact with the source/drain region and in contact with the gate spacer; depositing a metallic layer over the first layer of silicon material; and performing a silicidation process to form a source/drain contact including a silicide.

According to another embodiment, a method of making a semiconductor device includes forming a source/drain region over a substrate; disposing a gate stack over the substrate and adjacent to the source/drain region, the gate stack including a gate spacer along a sidewall of the gate stack; disposing an ILD layer over the source/drain region and the gate stack; removing a portion of the ILD layer over the source/drain region to form a source/drain contact pattern; and depositing a metal-silicon alloy into source/drain contact pattern to fill the source/drain contact pattern; and performing a silicidation process to form a silicide in the source/drain contact pattern, the silicide being in contact with the source/drain region and in contact with the gate spacer.

Yet, according to another embodiment, a semiconductor device includes a substrate; a gate disposed over the substrate; a spacer arranged along a sidewall of the gate; a source/drain disposed over the substrate and adjacent to the spacer; and a source/drain contact formed over and in contact with the source/drain and over and in contact with the spacer, the source/drain contact including a silicide disposed along a sidewall of the source/drain contact, over the spacer, and filled within the source/drain contact.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-9 illustrate exemplary methods of making semiconductor devices according to a first embodiment, in which:

FIG. 1 is a cross-sectional side view of source/drain regions between gate stacks disposed over a substrate;

FIG. 2 is a cross-sectional side view after etching to form source/drain contact via patterns over the source/drain regions;

FIG. 3 is a cross-sectional side view after etching the inter-level dielectric (ILD) layer to widen the source/drain contact via opening;

FIG. 4 is a cross-sectional side view after filling the source/drain contact trenches with silicon;

FIG. 5 is a cross-sectional side view after recessing the silicon below the ILD layer;

FIG. 6 is a cross-sectional side view after depositing a conformal layer of a metal over the silicon and the ILD layer;

FIG. 7 is a cross-sectional side view after performing a silicidation process to form a silicide within the source/drain contact vias;

FIG. 8 is a cross-sectional side view after selectively removing the conformal metal layer;

FIG. 9 is a cross-sectional side view after forming the final source/drain contacts;

FIGS. 10-12 illustrate exemplary methods of making semiconductor devices according to a second embodiment, in which:

FIG. 10 is a cross-sectional side view after depositing alternating metal layers and silicon layers in the source/drain contact via patterns of FIG. 3;

FIG. 11 is a cross-sectional side view after performing a silicidation process to form a silicide within the source/drain contact vias;

FIG. 12 is a cross-sectional side view after forming the final source/drain contacts.

DETAILED DESCRIPTION

Figure 1:
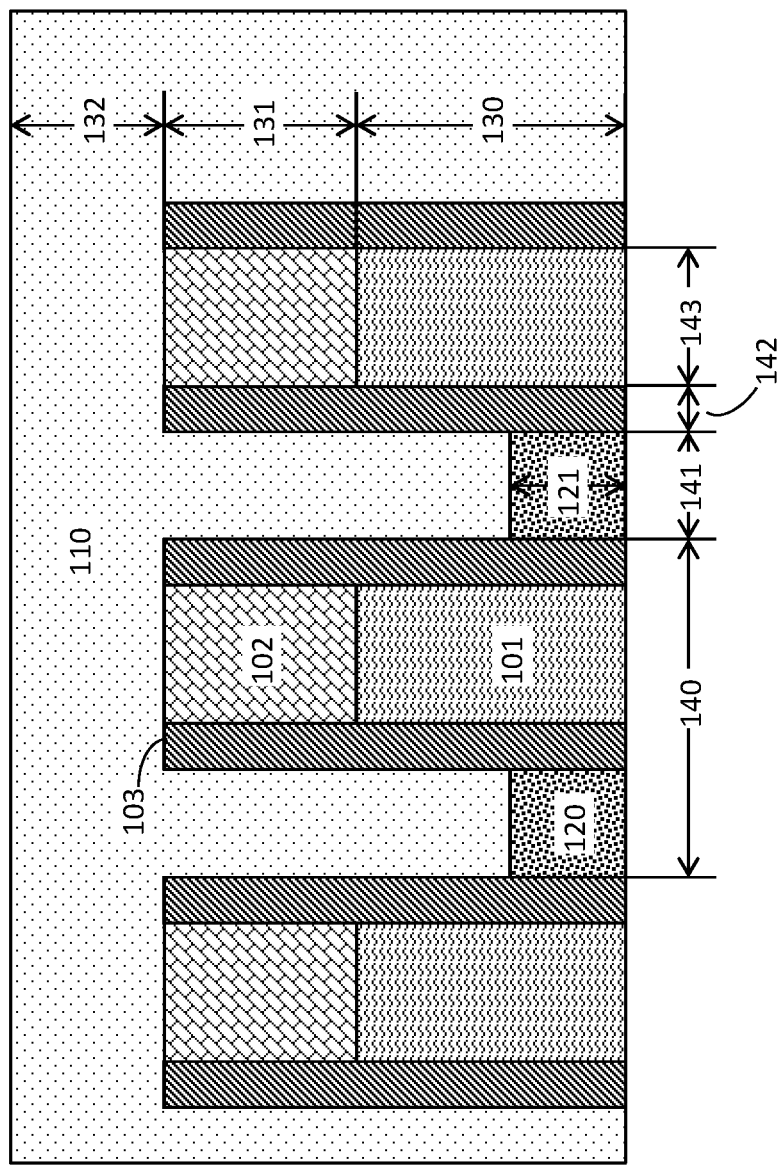

As semiconductor devices scale to smaller dimensions, contact resistance may increase, which may decrease external device performance. Some methods for decreasing contact resistance include changes to contact materials. Because metal liners used in contacts may have higher resistivity than bulk metals, increasing the proportion of metal liners to bulk metals in device contact vias may increase overall device resistance. Devices that include small, i.e., 10×10 nanometer (nm) square vias, for example, are the most negatively impacted by the high resistance liners.

Accordingly, various embodiments described herein provide devices and methods of making semiconductor devices with source/drain contacts without a metal liner. The methods form a low resistance via/contact to the source/drain region of a transistor. In some embodiments, the source/drain regions and vias are filled with, for example, amorphous silicon, a metal, or a silicon-metal alloy. A low temperature silicidation is performed to provide a low resistance via/contact without a liner on the via sidewall. A barrier layer disposed onto the contact prevents further silicidation. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Turning now to the Figures, FIGS. 1-9 illustrate exemplary methods of making semiconductor devices according to a first embodiment. FIG. 1 is a cross-sectional side view of source/drain regions 120 (active areas/regions) between gates 101 formed over a substrate (not shown).

Non-limiting examples of suitable substrate materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. Other examples of suitable substrates include silicon-on-insulator (SOI) substrates with buried oxide (BOX) layers.

In one embodiment, the transistor is a FinFET device. The substrate is etched to pattern a fin in the substrate material.

The gates 101 include a gate stack and are formed over the substrate. When the device is a FinFET device, the gates 101 are formed over a fin. The gate stack includes high-k metal gates formed, for example, by filling a dummy gate opening with one or more high-k dielectric materials, one or more workfunction metals, and one or more metal gate conductor materials. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes.

The work function metal(s) may be disposed over the high-k dielectric material. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal is deposited over the high-k dielectric material(s) and workfunction layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal to form the gates 101.

In some embodiments, the width 143 of the gates 101 is in a range from about 10 nm to about 30 nm. In other embodiments, the width 132 of the gates 101 is in a range from about 12 to about 24 nm. Yet, in other embodiments, the width 132 of the gates 101 is in a range about or in any range from about 12, 13, 14, 15, 16, 17, 18, 19, 20, 21, 22, 23, and 24 nm.

In some embodiments, the height 130 of the gates 101 is in a range from about 30 nm to about 100 nm. In other embodiments, the height 130 of the gates 101 is in a range from about 30 to about 40 nm. Yet, in other embodiments, the height 130 of the gates 101 is about or in any range from about 30, 31, 32, 33, 34, 35, 36, 37, 38, 39, and 40 nm.

The gates 101 include a gate spacer 103 along a sidewall and in contact with the source/drain regions 120. To form the gate spacers 103, an insulating liner material is deposited over the gates 101 and etched by an anisotropic etching process, for example, reactive ion etching (ME). Non-limiting examples of suitable materials for the spacers 103 include dielectric oxides (e.g., silicon oxide), dielectric nitrides (e.g., silicon nitride), dielectric oxynitrides, SiOCN, SiBCN, or any combination thereof.

In some embodiments, the thickness 142 of the spacers 103 is in a range from about 4 to about 10 nm. In other embodiments, the thickness 142 of the spacers 103 is in a range from about 2 to about 10 nm. Yet, in other embodiments, the thickness 142 of the spacers 103 is about or in any range from about 2, 3, 4, 5, 6, 7, 8, 9, and 10 nm.

An insulating hard mask 102 (capping layer) is disposed over the gates 101. Non-limiting examples of suitable materials for the hard mask 102 include silicon nitride (SiN), SiOCN, SiBCN, or a combination thereof.

In some embodiments, the thickness 131 of the hard mask 102 is in a range from about 20 to about 50 nm. In other embodiments, the thickness 132 of the hard mask 102 is in a range from about 20 to about 30 nm. Yet, in other embodiments, the thickness 132 of the hard mask 102 is about or in any range from about 20, 21, 22, 23, 24, 25, 26, 27, 28, 29, and 30 nm.

The source/drain regions 120 are formed between the gates 101 and over the substrate. In some embodiments, the source/drain regions 120 are formed by growing an epitaxial growth layer over the substrate material beneath the gates 101. In other embodiments, the source/drain regions 120 may be formed by incorporating dopants into the substrate.

An epitaxial growth process may be performed to deposit a crystalline layer onto a crystalline substrate beneath. The underlying substrate acts as a seed crystal. Epitaxial layers may be grown from gaseous or liquid precursors. Epitaxial growth layers may be grown using vapor-phase epitaxy (VPE), molecular-beam epitaxy (MBE), liquid-phase epitaxy (LPE), or other suitable process. The epitaxial growth may include, for example, silicon, silicon germanium, and/or carbon doped silicon (Si:C) silicon. The epitaxial growth can be doped during deposition by adding a dopant or impurity to form a silicide. The silicon may be doped with an n-type dopant (e.g., phosphorus or arsenic) or a p-type dopant (e.g., boron or gallium), depending on the type of transistor.

In some embodiments, the thickness 121 of the epitaxial growth forming the source/drain regions 120 is in a range from about 10 to about 50 nm. In other embodiments, the thickness 121 of the epitaxial growth forming the source/drain regions 120 is in a range from about 10 to about 20 nm. Yet, in other embodiments, the thickness 121 of the epitaxial growth forming the source/drain regions 120 is about or in any range from about 10, 11, 12, 13, 14, 15, 16, 17, 18, 19, and 20 nm.

In some embodiments, the width 141 of the epitaxial growth forming the source/drain regions 120 is in a range from about 10 to about 50 nm. In other embodiments, the width 141 of the epitaxial growth forming the source/drain regions 120 is in a range from about 10 to about 18 nm. Yet, in other embodiments, the width 141 of the epitaxial growth forming the source/drain regions 120 is about or in any range from about 10, 11, 12, 13, 14, 15, 16, 17, and 18 nm.

In one embodiment, the total width 140 of the epitaxial growth forming the source/drain 120, gate 101, and gate spacers 103 is in a range from about 3 to about 10 nm. In another embodiment, the total width 140 of the epitaxial growth forming the source/drain 120, gate 101, and gate spacers 103 is in a range from about 34 to about 54 nm. Yet, in other embodiments, the total width 140 of the epitaxial growth forming the source/drain 120, gate 101, and gate spacers 103 is about or in any range from about 34, 35, 36, 37, 38, 39, 40, 41, 42, 43, and 44 nm.

An inter-level dielectric (ILD) layer 110 is deposited as a blanket layer over the gates 101 and the source/drain regions 120. The ILD layer 110 may be formed from, for example, a low-k dielectric oxide, including but not limited to, silicon dioxide, spin-on-glass, a flowable oxide, a high density plasma oxide, borophosphosilicate glass (BPSG), or any combination thereof. The ILD layer 110 deposited by a suitable deposition process, including, but not limited to CVD, PVD, plasma enhanced CVD, atomic layer deposition (ALD), evaporation, chemical solution deposition, or like processes.

In some embodiments, the thickness 132 of the ILD layer 110 over the hard masks 102 over the gates 101 is in a range from about 30 to about 100 nm. In other embodiments, the thickness 132 of the ILD layer 110 is in a range from about 15 to about 25 nm. Yet, in other embodiments, the thickness 132 of the ILD layer 110 is about or in any range from about 15, 16, 17, 18, 19, 20, 21, 22, 23, 24, and 25 nm.

Figure 2:
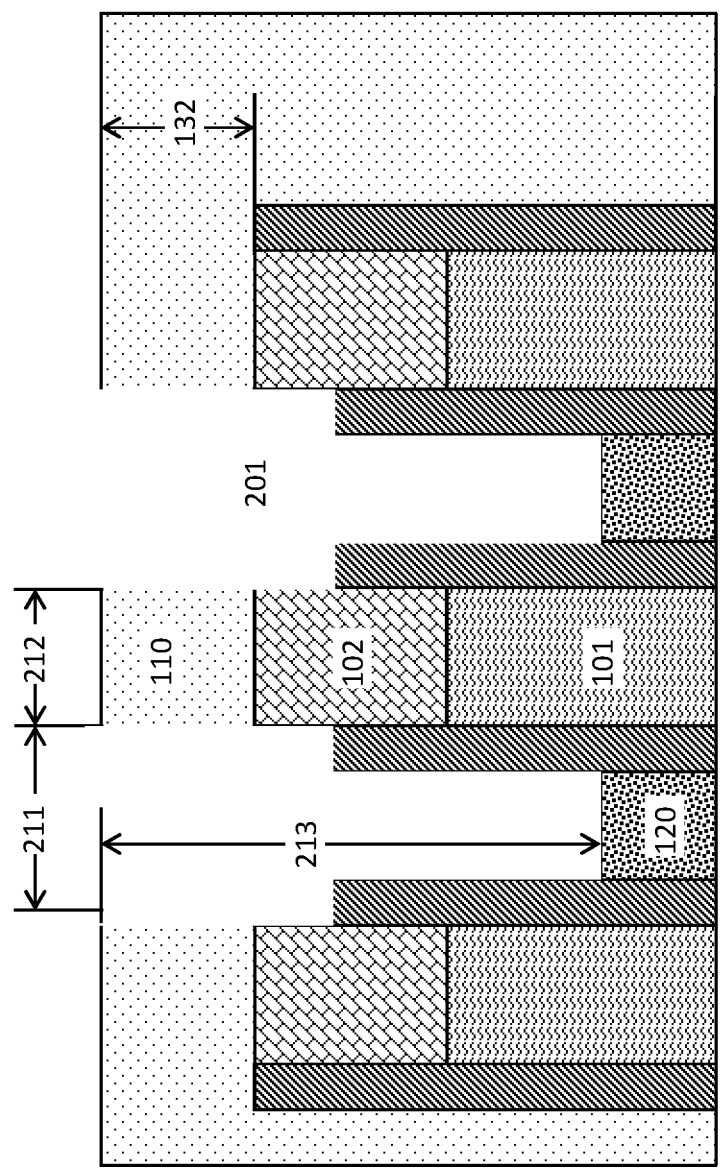

FIG. 2 is a cross-sectional side view after etching to form source/drain contact via patterns 201 over the source/drain regions 120. An etching process is employed to remove a portion of the ILD layer 110 over the source/drain regions 120 between the gates 101. The ILD layer 110 is removed down to the level of the source/drain regions 120. A portion of the ILD layer 110 over the spacers 103 is also removed.

The ILD layer 110 may be etched by, for example, a chemical mechanical planarization (CMP) process or a reactive ion etching (ME) process.

In one embodiment, the source/drain contact via pattern 201 has a depth 213 in a range from about 50 to about 100 nm. In other embodiments, the source/drain contact via pattern 201 has a depth 213 in a range from about 60 to about 70 nm. Yet, in other embodiments, the source/drain contact via pattern 201 has a depth 213 in a range about or in any range from about 60, 61, 62, 63, 64, 65, 66, 67, 68, 69, and 70 nm.

In some embodiments, the source/drain contact via pattern 201 has a width 211 in a range from about 15 to about 30 nm. In other embodiments, the source/drain contact via pattern 201 has a width 211 in a range from about 20 to about 28 nm. Yet, in other embodiments, the source/drain contact via pattern 201 has a width 211 in a range about or in any range from about 20, 21, 22, 23, 24, 25, 26, 27, 28, 29, and 30 nm.

The spacers 103 and/or a portion of the hard mask 102 are recessed by employing an etching process. The spacers 103 are etched below the level of the ILD layer 110 and the hard mask layer 102. The etching process may be, for example, a selective RIE process.

The spacers 103 are recessed by an amount in a range from about 10 to about 20 nm. In some embodiments, the spacers 103 are recessed by an amount in a range from about 5 to about 15 nm. Yet, in other embodiments, the spacers 103 are recessed by an amount about or in any range from about 5, 6, 7, 8, 9, 10, 11, 12, 13, 14, and 15 nm.

After recessing the spacers 103, the width 212 of the ILD layer 110 remaining between source/drain contact via patterns 201 is in a range from about 15 to about 30 nm. In some embodiments, the width 212 of the ILD layer 110 remaining between source/drain contact via patterns 201 is in a range from about 15 to about 25 nm. Yet, in other embodiments, the width 212 of the ILD layer 110 remaining between source/drain contact via patterns 201 is about or in any range from about 15, 16, 17, 18, 19, 20, 21, 22, 23, 24, and 25 nm.

Figure 3:
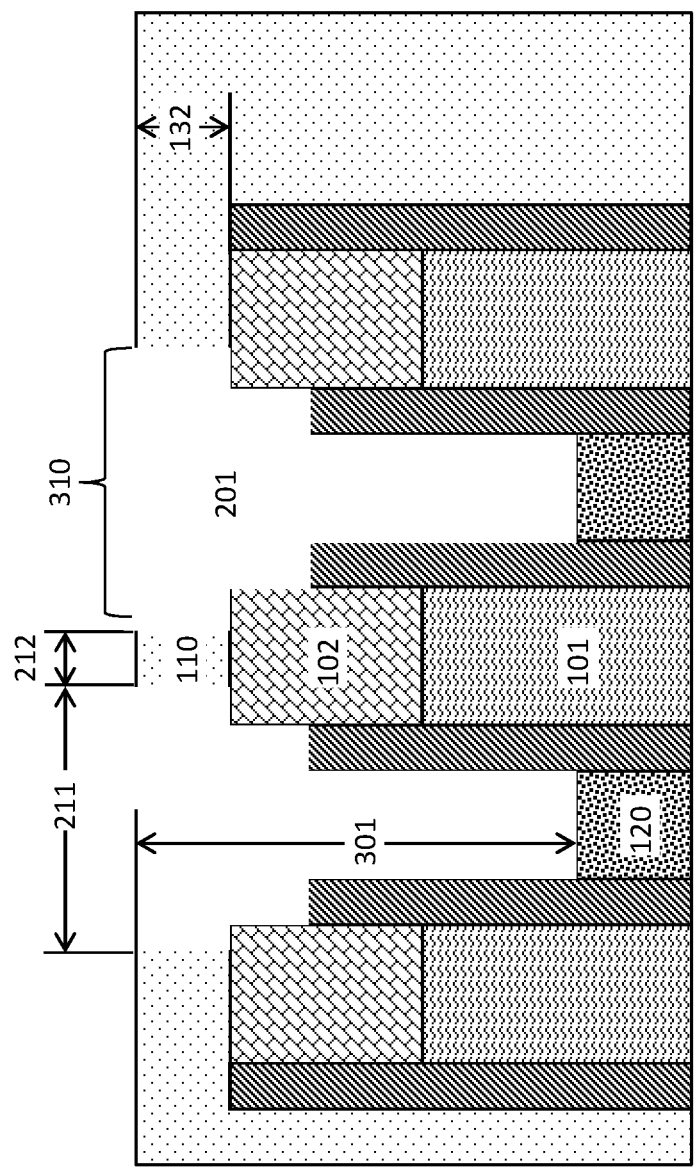

FIG. 3 is a cross-sectional side view after etching the ILD layer 110 to widen the source/drain contact via 201 openings 310. The ILD layer 110 is etched (or pre-cleaned) by, for example, using an acidic or aqueous solution to flush the surface of the ILD layer 110. The pre-clean process may remove oxides from the surface of the ILD layer. The pre-clean process may include employing, for example, a dilute hydrofluoric acid process.

In some embodiments, the width 211 of the source/drain contact via pattern 201 openings 310 increases by an amount in a range from about 5 to about 10 nm. In other embodiments, the width 211 of the source/drain contact via pattern 201 openings 310 increases by an amount in a range from about 5 to about 10 nm. Yet, in other embodiments, the width 211 of the source/drain contact via pattern 201 openings 310 increase by an amount about or in any range from about 5, 6, 7, 8, 9, 10, 11, 12, 13, 14, and 15 nm.

As material is removed from the ILD layer 110 to widen the openings 310, the thickness 132 of the ILD layer 110 also decreases. The thickness 132 of the ILD layer 110 decreases by an amount in a range from about 20 to about 40 nm. In some embodiments, the thickness 132 of the ILD layer 110 decreases by an amount in a range from about 1 to about 10 nm.

Figure 4:
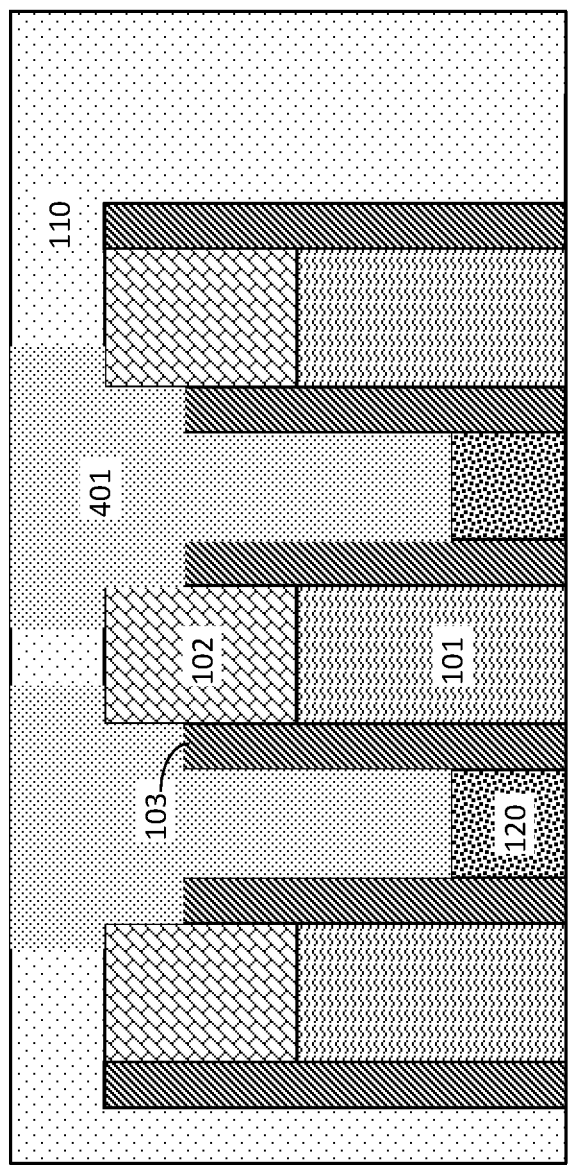

FIG. 4 is a cross-sectional side view after filling the source/drain contact via patterns 201 with silicon 401, for example, amorphous silicon (aSi) or polycrystalline silicon (polysilicon). The aSi or polysilicon may be deposited using a blanket deposition process. Non-limiting examples of suitable deposition processes include CVD processes.

The aSi or polysilicon also may be deposited using an epitaxial growth process, as described above. The epitaxial growth process may be selective or non-selective.

Figure 5:
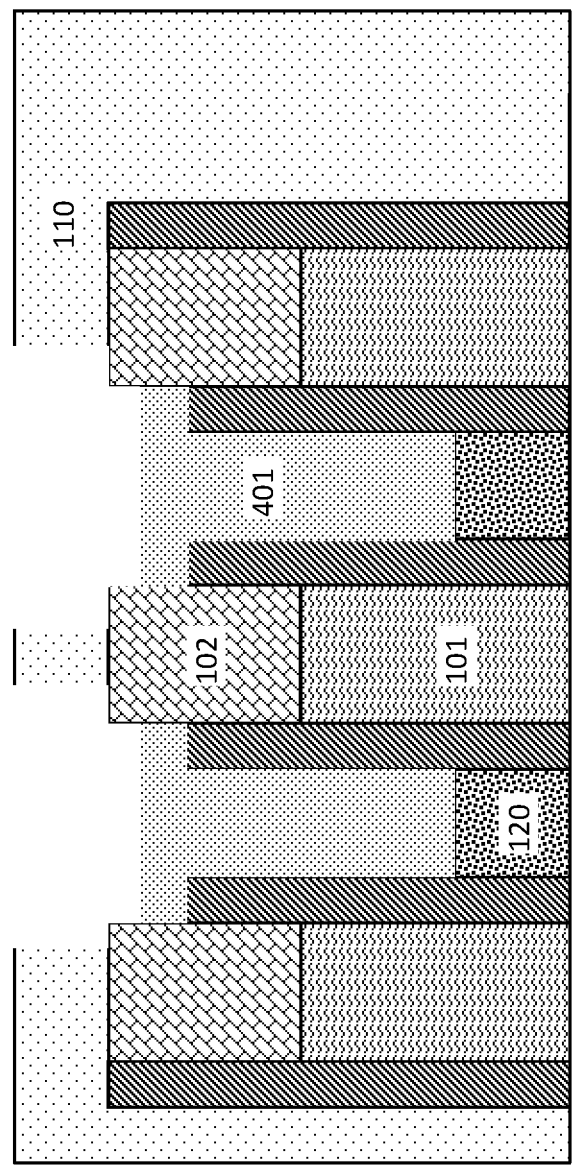

FIG. 5 is a cross-sectional side view after recessing the silicon 401 to a level below the ILD layer 110. The silicon 401 is recessed to a level that is below the hard mask 102 and above the recessed spacers 103.

An etching process, for example, a RIE process may be employed to recess the silicon (remove a portion of the silicon 401 material).

Figure 6:
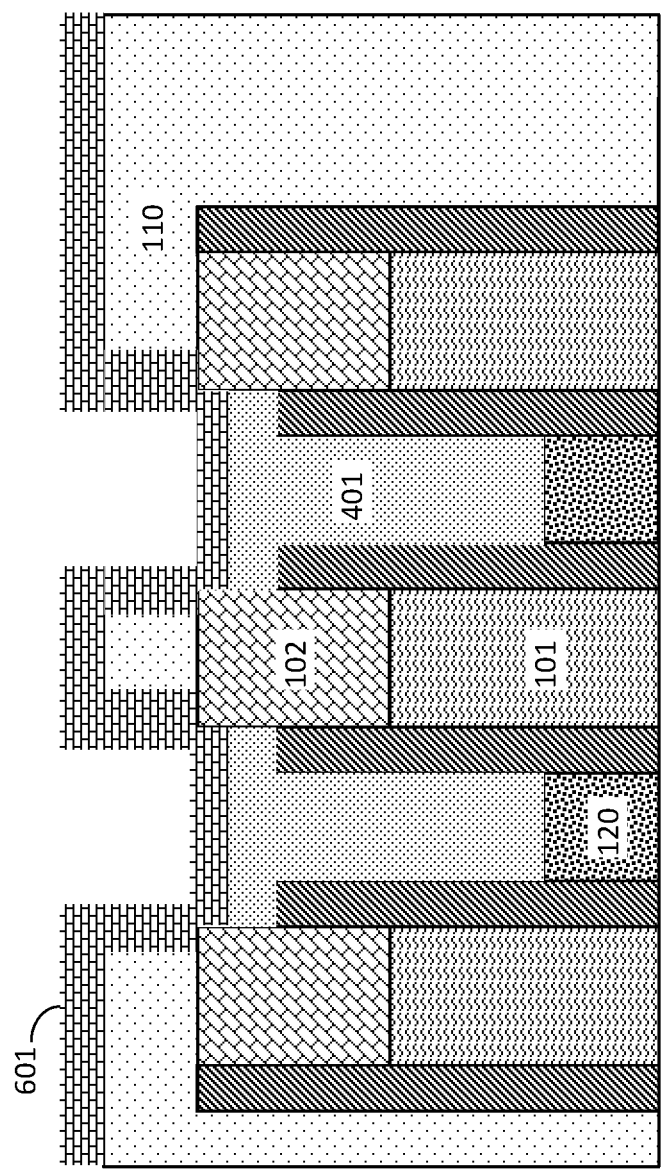

FIG. 6 is a cross-sectional side view after depositing a conformal metallic layer 601 over the recessed silicon 401 and the ILD layer 110. The conformal metallic layer 601 may be deposited using a deposition process, which depends on the type of refractory metal(s). The deposition process may include, but is not limited to, chemical vapor deposition CVD, PVD, ALD, or any combination thereof.

Non-limiting examples of metals for the conformal metallic layer 601 include conductive metals and/or refractory metals. Non-limiting examples of conductive metals include nickel, titanium, gold, silver, platinum, palladium, or a combination thereof. Non-limiting examples of refractory metals include niobium, molybdenum, tantalum, tungsten, rhenium, titanium, vanadium, zirconium, hafnium, osmium, iridium, or a combination thereof.

Figure 7:
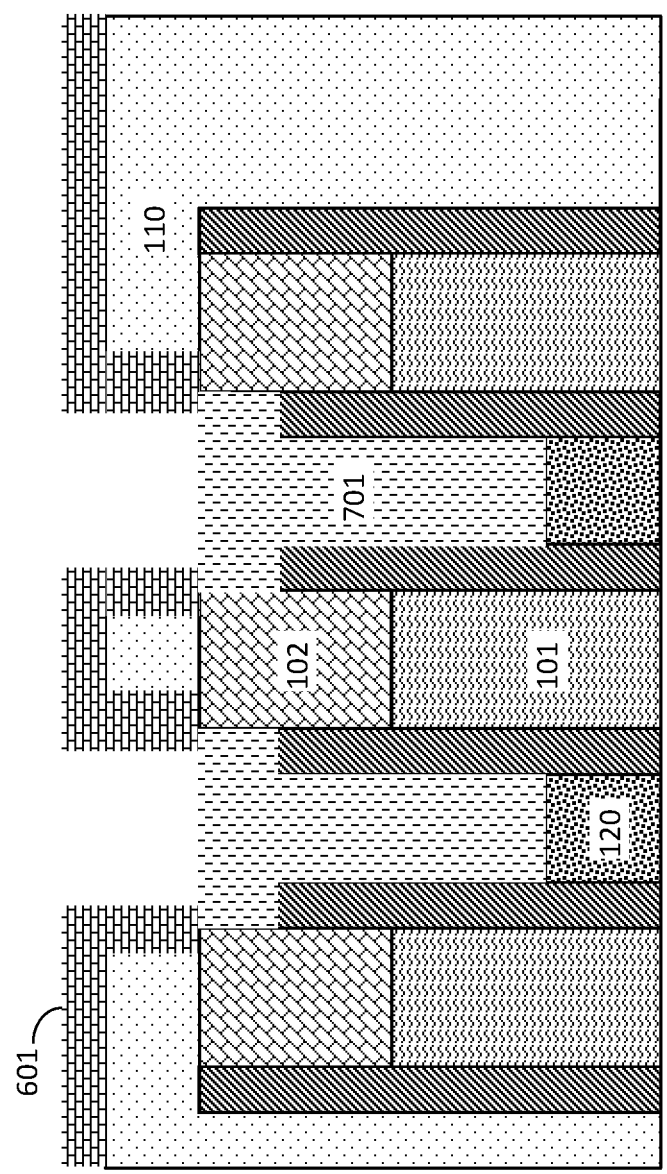

FIG. 7 is a cross-sectional side view after performing a silicidation process to form a silicide 701 within the source/drain contact via patterns 201. The silicidation process is a low temperature silicidation process. The silicidation process substantially fully consumes the silicon 401 to form a metal silicide that includes the metal from the metallic layer 601 and the silicon 401. The silicidation process includes thermal annealing to produce a metal-rich silicon material, or a metal silicide. In one exemplary embodiment, the silicide includes nickel silicide.

The thermal annealing is performed at a low temperature, for example, at a temperature in a range from about 300 to about 600° C. In some embodiments, the silicidation process is performed at a temperature in a range from about 300 to about 600° C.

Figure 8:
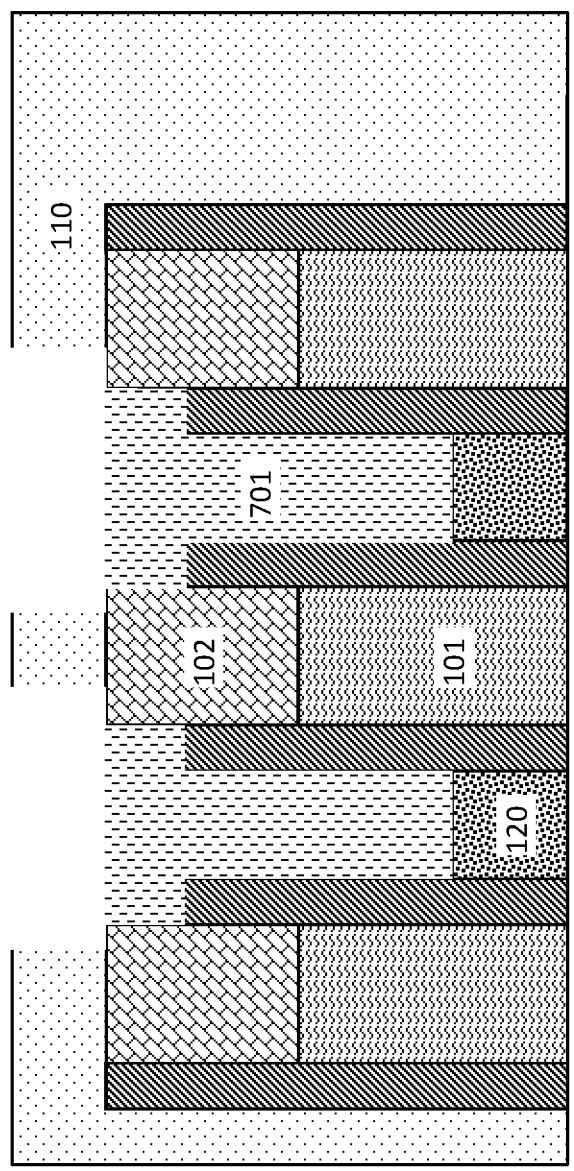

FIG. 8 is a cross-sectional side view after selectively removing the unreacted metallic layer 601. The portion of the metallic layer 601 that was not consumed in the silicidation process to form the silicide 701 is removed.

The unreacted metallic layer 601 may be selectively removed by employing an etching process. The etching process may be, for example, an RIE process.

Figure 9:
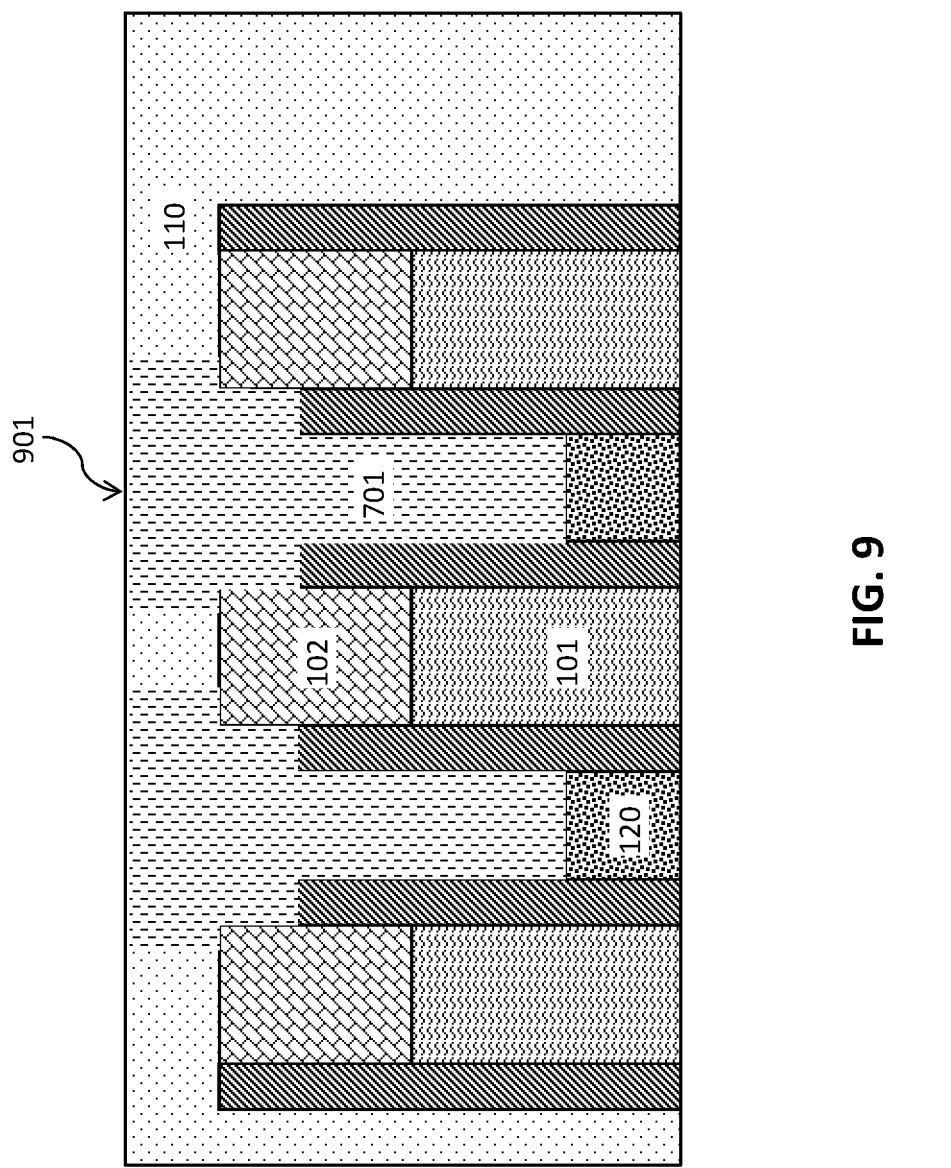

FIG. 9 is a cross-sectional side view after forming the final source/drain contacts 901. The source/drain contacts 901 are formed by, for example, depositing a layer of conductive material and/or more silicide material over the silicide 701. Once the layer of conductive material is deposited, a planarization process, such as RIE, is performed to remove the excess conductive material disposed over the ILD layer 110 and to form the source/drain contacts 901.

Figure 10:
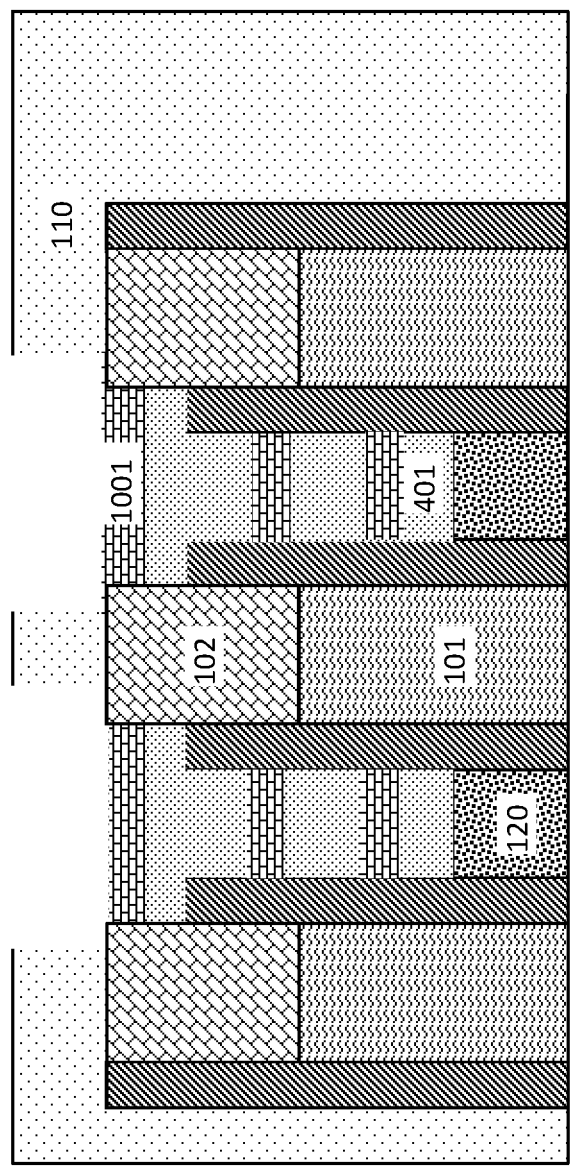
Figure 11:
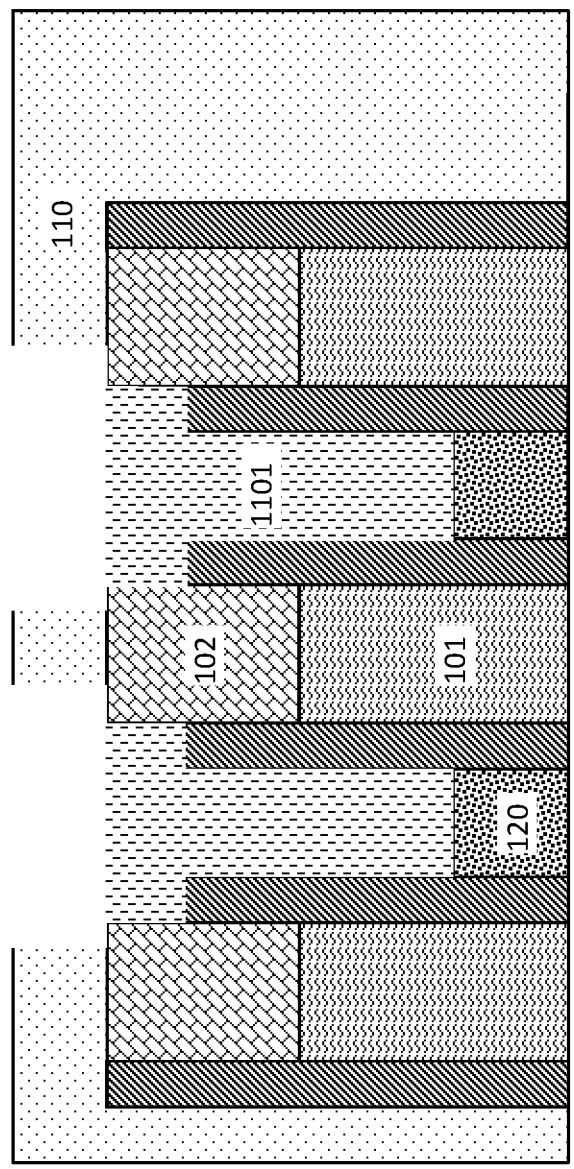
Figure 12:
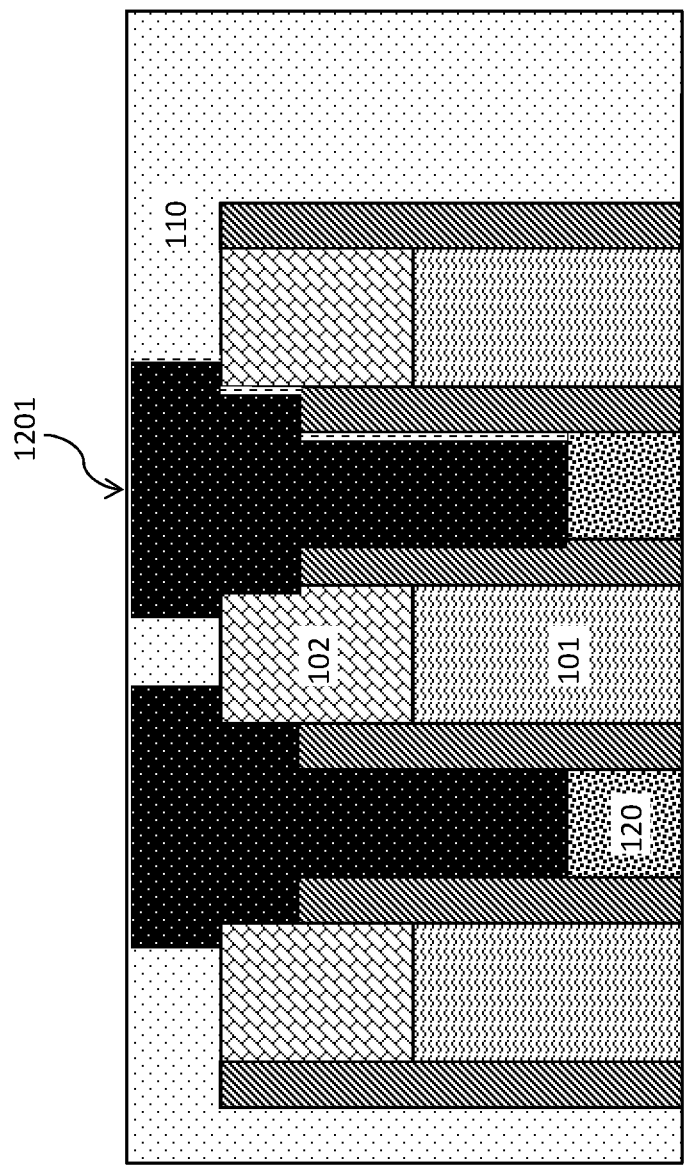

FIGS. 10-12 illustrate exemplary methods of making semiconductor devices according to a second embodiment. FIG. 10 is a cross-sectional side view after depositing metallic layers 1001 between silicon layers 401 in the source/drain contact vias of FIG. 3.

One or more metallic layers 1001 may be deposited between the silicon 401 (aSi or polysilicon). The metallic layers 1001 are deposited over the silicon layers 401. The metallic layer(s) 1001 include any of the above described conductive and refractory metals described for metallic layer 601 (see FIG. 6). The alternating layers of metallic layer 1001 and silicon layer 401 may be formed by alternate deposition and etching processes. Including the additional metallic layers 1001 between the silicon layers 401, instead of a bulk silicon layer as shown in FIGS. 5 and 6, may reduce the anneal time for silicidation (see FIG. 11 below).

In one embodiment, the source/drain contact via patterns 201 are filled by depositing a first amorphous silicon layer onto the source/drain region, depositing a metallic layer onto the first amorphous silicon layer, depositing a second amorphous silicon layer onto metallic layer, and performing a silicidation process to form the silicide. Additional metallic layers and/or amorphous silicon layers may be included.

In one exemplary embodiment, the metallic layer 1001 includes Ni, and the silicon layer 401 includes aSi. Additional contact layer(s) may be inserted between the source/drain regions 120 and the silicon layers 401.

FIG. 11 is a cross-sectional side view after performing a silicidation process to form a silicide 1101 within the source/drain contact vias. The silicidation process is a low temperature silicidation process and is described above in FIG. 7. The silicidation process substantially fully consumes the silicon 401 to form a metal silicide, including the metal from the metallic layer 1001 and the silicon 401.

FIG. 12 is a cross-sectional side view after forming the final source/drain contacts 1201. The source/drain contacts 1201 are formed by, for example, depositing a layer of conductive material and/or more silicide material over the silicide 1101. Once the layer of conductive material is deposited, a planarization process, such as an RIE process, is performed to remove the excess conductive material disposed over the ILD layer 110 and to form the source/drain contacts 901.

Figure 13:
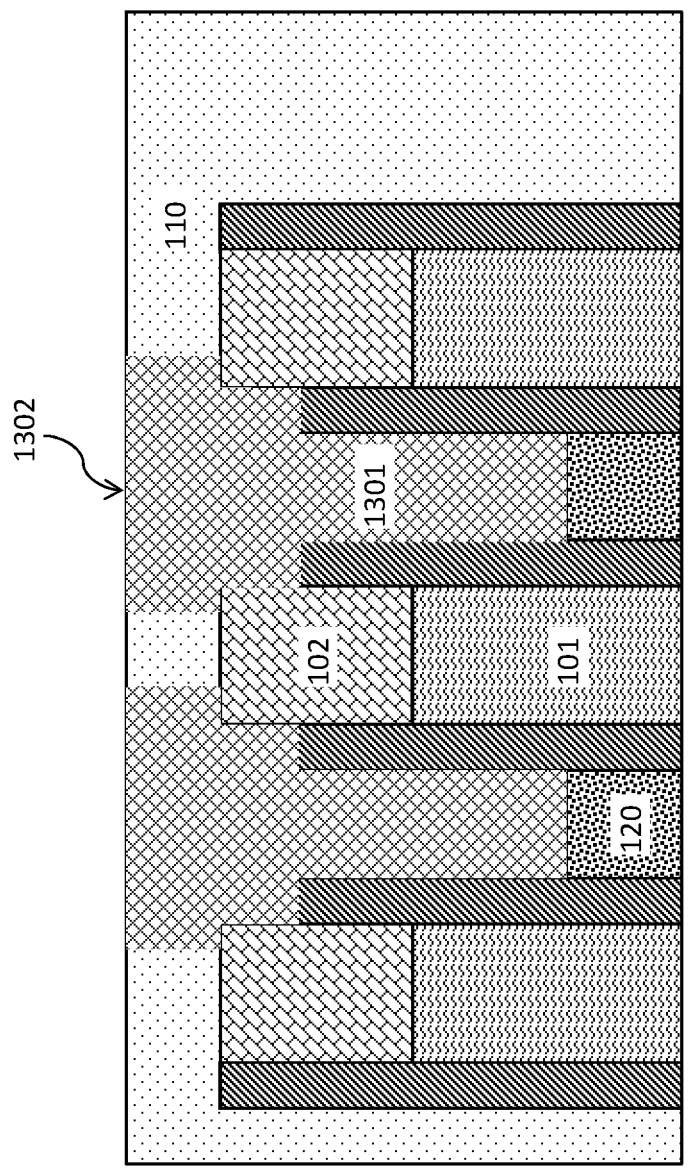
FIG. 13 illustrates an exemplary method of making a semiconductor device according to a third embodiment, in which a metal-silicon alloy is deposited directly into the source/drain contact vias of FIG. 3, and a silicidation process is employed for form the silicide.

FIG. 13 illustrates an exemplary method of making a semiconductor device according to a third embodiment. A metal-silicon alloy is deposited directly into the source/drain contact vias 201 of FIG. 3. The metal-silicon alloy may be deposited using a deposition process, for example, a PVD process (e.g., sputtering) or a CVD process. The metal-silicon includes a refractory or conductive metal described above for conformal metallic layer 601.

A silicidation process is performed to convert the metal-silicon alloy into the silicide 1301. The silicidation process may be a low temperature silicidation process described above in FIG. 7.

The metal-silicon alloy will be deposited as a blanket layer onto the ILD layer 110, as well as into the source/drain contact vias 201. A planarization process, for example, a process including a CMP process, is employed to polish the surface of the ILD layer 110 and form the final source/drain contacts 1302.

The final source/drain contacts 901, 1201, 1302 are formed without using a high resistance contact liner and consist essentially of the silicide material. The final source/drain contacts 901, 1201, 1302 are borderless. The source/drain contacts 901, 1201, 1301 include a first portion adjacent to the spacer and a second portion over the spacer, the first portion having a width that is less than the second portion.

Employing the low temperature silicidation process provides a low resistance source/drain contact (via) without a liner along any of the contact sidewalls. The final source/drain contacts 901, 1201, 1302 have low contact resistance, e.g., about 10 ohm to about 30 ohm.

As described above, various embodiments described herein provide devices and methods of making semiconductor devices with source/drain contacts without a metal liner. The methods form a low resistance via/contact to the source/drain region of a transistor. The source/drain regions and vias are filled with an amorphous silicon (or polysilicon), a refractory metal, or a silicon/refractory metal alloy. A low temperature silicidation is performed to provide a low resistance via/contact without a liner on the via sidewalls. A barrier layer disposed onto the contact prevents further silicidation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a semiconductor device, the method comprising:
    forming a source/drain region on a substrate;
    disposing a gate stack on the substrate and adjacent to the source/drain region, the gate stack comprising a gate spacer along a sidewall of the gate stack;
    disposing an inter-level dielectric (ILD) layer on the source/drain region and the gate stack;
    removing a portion of the ILD layer on the source/drain region to form a source/drain contact pattern;
    filling the source/drain contact pattern with a layer of silicon material, the layer of silicon material being in contact with the source/drain region and in contact with the gate spacer;
    depositing a metallic layer over the layer of silicon material; and
    performing a silicidation process to form a source/drain contact comprising a silicide, the silicide of the source/drain contact extending continuously from the gate spacer to a second gate spacer of an adjacent second gate stack.

2. The method of claim 1, wherein the silicidation process includes a low temperature annealing process.

3. The method of claim 2, wherein the low temperature annealing process substantially fully consumes the silicon material to form the metal silicide.

4. The method of claim 3, wherein the metal silicide is nickel silicide.

5. The method of claim 2, wherein the low temperature annealing process is performed at a temperature in a range from about 300 to about 600° C.

6. The method of claim 1, wherein the metallic layer comprises a refractory metal.

7. The method of claim 1, wherein the source/drain contact consists essentially of the silicide.

8. The method of claim 1, wherein filling the source/drain contact pattern with the silicide further comprises depositing another silicon layer onto the metallic layer and depositing another a metallic layer onto the another silicon layer.

9. The method of claim 1, wherein performing the silicidation process comprises performing a thermal annealing process at a temperature in a range from about 300 to about 600° C.

10. The method of claim 1, further comprising pre-cleaning the source/drain contact pattern after removing a portion of the ILD layer.

\* \* \* \* \*